United States Patent
van't Erve et al.

(10) Patent No.: US 11,156,678 B2
(45) Date of Patent: Oct. 26, 2021

(54) MAGNETIC FIELD SENSOR USING IN SITU SOLID SOURCE GRAPHENE AND GRAPHENE INDUCED ANTI-FERROMAGNETIC COUPLING AND SPIN FILTERING

(71) Applicant: The Government of the United States of America, as represented by the Secretary of the Navy, Arlington, VA (US)

(72) Inventors: Olaf M. J. van't Erve, Falls Church, VA (US); Enrique Cobas, Capitol Heights, MD (US); Shu-Fan Cheng, Silver Spring, MD (US); Berend T. Jonker, Waldorf, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 148 days.

(21) Appl. No.: 16/274,650

(22) Filed: Feb. 13, 2019

(65) Prior Publication Data

US 2019/0265312 A1 Aug. 29, 2019

Related U.S. Application Data

(62) Division of application No. 15/425,731, filed on Feb. 6, 2017, now Pat. No. 10,261,139.

(60) Provisional application No. 62/297,550, filed on Feb. 19, 2016.

(51) Int. Cl.
*G01R 33/09* (2006.01)
*H01F 10/32* (2006.01)
*H01F 10/30* (2006.01)
*G01R 33/00* (2006.01)

(52) U.S. Cl.
CPC ....... *G01R 33/093* (2013.01); *G01R 33/0052* (2013.01); *H01F 10/30* (2013.01); *H01F 10/3254* (2013.01); *H01F 10/3272* (2013.01); *Y10T 428/1114* (2015.01)

(58) Field of Classification Search
None
See application file for complete search history.

(56) References Cited

U.S. PATENT DOCUMENTS

| | | | | |
|---|---|---|---|---|
| 8,711,600 B2* | 4/2014 | Venkataraman | ... | G11C 13/0014 365/145 |
| 2009/0321860 A1* | 12/2009 | Klostermann | ..... | H01L 43/08 257/421 |
| 2009/0322319 A1* | 12/2009 | Kreupl | ..... | G01R 33/098 324/207.21 |
| 2010/0007995 A1* | 1/2010 | Sasaki | ..... | G11B 5/3912 360/319 |
| 2010/0188782 A1* | 7/2010 | Yamazaki | ..... | G11B 5/398 360/294 |

(Continued)

OTHER PUBLICATIONS

Bhaviripudi et al. (Nanoletters, 2010, 10, 4126-4133). (Year: 2010).*

(Continued)

*Primary Examiner* — Kevin M Bernatz
(74) *Attorney, Agent, or Firm* — US Naval Research Laboratory; Stephen T. Hunnius

(57) ABSTRACT

A magnetic field sensor based on two anti-ferromagnetically coupled magnetic layers separated by multilayer graphene, prepared in a single sputter chamber without a vacuum break.

10 Claims, 5 Drawing Sheets

(56) References Cited

U.S. PATENT DOCUMENTS

| | | | |
|---|---|---|---|
| 2011/0149670 A1* | 6/2011 | Heo | B82Y 25/00 365/225.5 |
| 2011/0211272 A1* | 9/2011 | Butler | G11C 11/161 360/55 |
| 2013/0100724 A1* | 4/2013 | Venkataraman | G11B 9/149 365/145 |
| 2013/0170290 A1* | 7/2013 | Odagawa | H01L 29/66984 365/158 |
| 2014/0070168 A1* | 3/2014 | Seneor | H01L 51/5092 257/26 |
| 2014/0151826 A1* | 6/2014 | Keiber | H01L 21/02433 257/421 |
| 2014/0166959 A1* | 6/2014 | Bertin | H01L 27/249 257/2 |
| 2014/0273259 A1* | 9/2014 | Friedman | G01N 33/0057 436/112 |
| 2015/0129994 A1* | 5/2015 | Bowen | H01L 43/10 257/421 |
| 2015/0299850 A1* | 10/2015 | Cobas | C23C 16/56 427/131 |
| 2015/0299852 A1* | 10/2015 | Ozkan | H01L 31/068 136/255 |
| 2015/0303059 A1* | 10/2015 | Friedman | H01L 21/02527 257/29 |
| 2016/0111633 A1* | 4/2016 | Hsueh | H01L 43/08 257/29 |
| 2016/0169986 A1* | 6/2016 | Li | H01L 43/08 324/228 |
| 2017/0062435 A1* | 3/2017 | Im | B82Y 10/00 |
| 2017/0194098 A1* | 7/2017 | Chang | H01G 4/008 |
| 2018/0130897 A1* | 5/2018 | Friedman | H01L 21/041 |
| 2019/0320458 A1* | 10/2019 | Hosseini | H04W 72/14 |
| 2020/0264248 A1* | 8/2020 | Xu | H01L 43/08 |

OTHER PUBLICATIONS

Cobas et al. (Nanoletters, 2012,12,3000-3004) (Year: 2012).*
Iqbal et al. (Nano Res., 2013, 6(5), 373-380) (Year: 2013).*

* cited by examiner

MAGNETIC FIELD SENSOR USING IN SITU SOLID SOURCE GRAPHENE AND GRAPHENE INDUCED ANTI-FERROMAGNETIC COUPLING AND SPIN FILTERING

This application claims priority to and the benefits of U.S. Patent Application No. 62/297,550 filed on Feb. 19, 2016, and U.S. patent application Ser. No. 15/425,731 filed on Feb. 6, 2017, issued on Apr. 16, 2019 as U.S. Pat. No. 10,261,139, the entirety of each are herein incorporated by reference.

BACKGROUND

Magnetic field sensors are ubiquitous, they are found as position, rotation and velocity sensors in vehicles and industrial equipment. They are also used for current sensing in high power applications and the advance in magnetic sensors has enabled the low-cost high-density hard disk industry.

For magnetic sensors to be attractive they need to have a high magnetoresistance (MR>100%), have a linear response in a small magnetic field (%/Oe), and have low resistance (high signal to noise).

Presently, magnetic sensors have high magnetoresistance (MR>100%), for example MgO based magnetic tunnel barriers, but these have a high resistance due to the nature of the tunnel barrier. Hall sensors are cheap and have a linear response but a very low sensitivity (%/Oe). Anisotropic magneto resistance sensors have low resistance and thus high signal to noise but very low magnetoresistance (MR<2-3%).

BRIEF SUMMARY OF THE INVENTION

This disclosure describes and demonstrates a magnetic field sensor based on two anti-ferromagnetically coupled magnetic layers separated by multilayer graphene, prepared in a single sputter chamber without a vacuum break.

DETAILED DESCRIPTION

Figure 1:
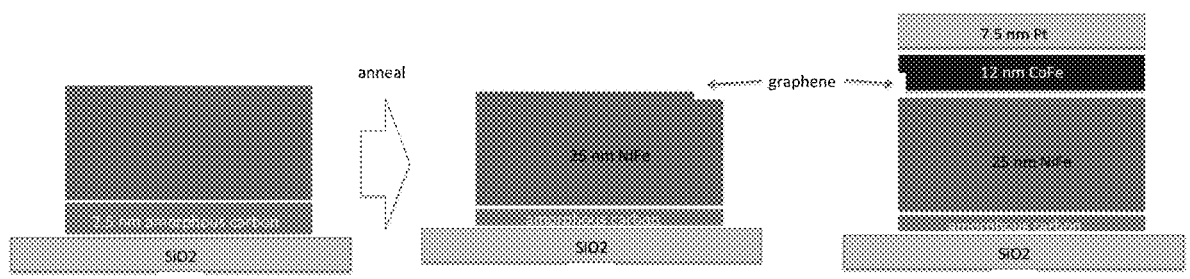
FIG. 1 is a schematic of a sputter process. Left is RT sputtering of amorphous carbon and NiFe. Middle, sample after anneal, multi layer graphene has formed on top of the NiFe film. At this point the sample is either taken out of the chamber for analysis or left in to proceed to the second magnetic layer. Right is a full sensor stack.

This disclosure describes and demonstrates a magnetic field sensor based on two anti-ferromagnetically coupled magnetic layers separated by multilayer graphene, prepared in a single sputter chamber without a vacuum break.

The key advantages include at least the following: 1) the potential for very high magnetoresistance values because of the spin filtering nature of multi-layer graphene; 2) the absence of hysteretic behavior, crucial for sensor application, due to the anti-ferro magnetic coupling induced by the graphene spacer layer; 3) the low resistance of the multilayer, crucial for high signal to ratio; and 4) very high sensitivity, large magnetoresistance response in a small magnetic field range.

In this disclosure is described how the use of multilayer graphene synthesized from a layer of sputtered amorphous carbon induces anti-ferromagnetic coupling between two ferromagnetic layers (ideal for magnetic sensors) and has low resistance and large magnetoresistance response in a small magnetic field.

Electron transport through multi-layer graphene only supports electrons with a momentum K. Graphene in close contact with ferromagnetic surfaces such as Ni(111) and Co(0002) have theoretically been shown only to have minority spin carriers with momentum K. For electrons with momentum different than K (the majority spin), the graphene is effectively an insulator or tunnel barrier. Multilayer graphene acts as a perfect spin filter between two magnetic layers in a similar fashion as MgO is a spin filter in MgO based tunnel barriers with TMR>100%.

The magnetic behavior of two magnetic layers separated by a non-magnetic layer depends on the interlayer exchange coupling. They are either anti-ferromagnetically coupled, ferromagnetically coupled, or free. For magnetic memory applications, it is desired that the coupling be free in order to arbitrarily switch one of the magnetic layers. This is not ideal for magnetic sensors, because this implies hysteretic switching behavior.

For a sensor, it is desired that the layers are anti-ferromagnetically coupled, such that the magnetization of the two layers are anti-parallel when no magnetic field is applied and an external magnetic field will overcome the exchange interaction and align the magnetizations parallel. The magnetoresistance response results from the change in resistance between the anti-parallel and the parallel magnetic orientation. A ferromagnetic coupling would have the two layers always parallel aligned and lead to zero magneto resistance. Multilayer graphene has theoretically been predicted to induce anti-ferromagnetic coupling.

Graphene is typically synthesized on a metal by exposure to high temperature ambient in the presence of a source of carbon. Here, in one example or embodiment, we will use graphene from solid source, such that we can build the whole sensor stack in a single process run in a sputtering chamber.

Example 1

The full stack was prepared in situ using DC magnetron sputtering in an AJA sputtering chamber with base pressure less than $3 \times 10^{-8}$ Torr. The sputtering guns were in a confocal geometry with ~15 degree of incidence angle and ~15 cm of distance between substrate and the gun.

The substrate, Silicon wafers with a 27.5 nm of thermal oxide, were ultrasonically cleaned 15 minutes each in acetone then alcohol. After loading, the substrate was back sputtered for three minutes at 10 W, 100V in 20 mTorr of Argon. 2.5 nm of amorphous carbon was grown at a rate of 0.31 nm per minute at 100 W in 3 mTorr of Ar. 25 nm of $Ni_{80}Fe_{20}$ was grown at 0.05 nm/sec at 100 W in 3 mTorr Ar.

Example 2

An in situ anneal at 875 C for 10 minutes was performed in a pressure below $2\times10^{-6}$ Torr. The sample was then allowed to cool down to room temperature at 10 C/min. After the sample was cooled down it was either unloaded for analysis or a layer of 12 nm $Co_{90}Fe_{10}$ was sputter deposited and capped with 7.5 nm of Pt, see FIG. 1.

Figure 5A:
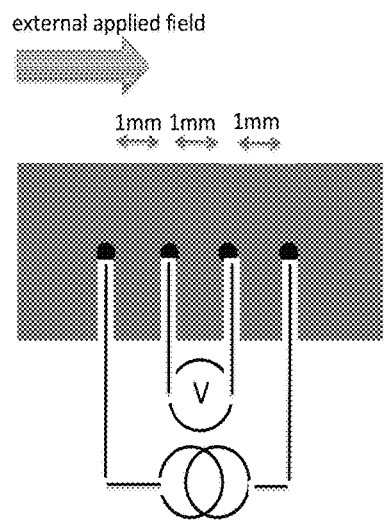
FIG. 5A illustrates a schematic and shows the external applied field.
Figure 5B:
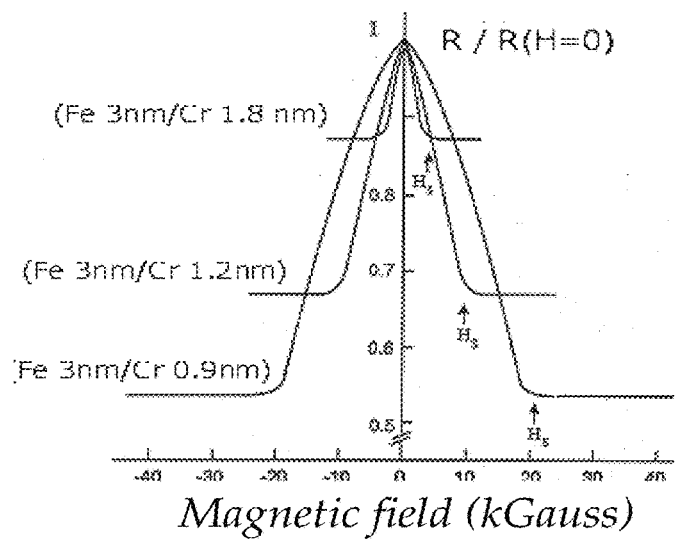
FIG. 5B illustrates the magnetic field.

FIG. 5 shows the 4 point resistance of the un-processed film. Four probes were place 1 mm apart and a Current Source was used to supply current to the outer contacts, while the potential difference between the two inner contacts was measured by a Keithley 2000 voltmeter in a standard four-probe electrical measurement. The normalized resistance versus magnetic field is shown in FIG. 5.

Figure 5C:
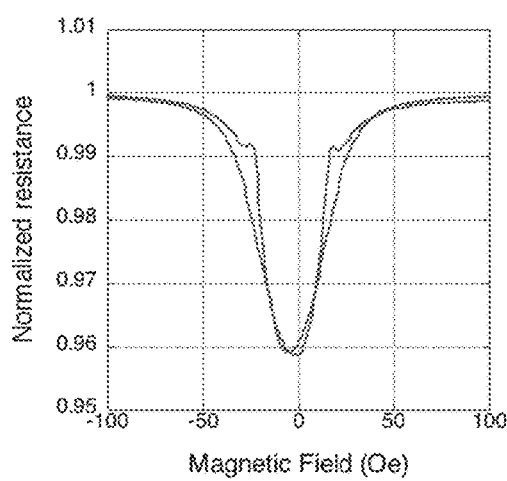
FIG. 5C is a graph illustrating normalized resistance vs applied field.

FIG. 5A illustrates a standard four probe resistance measurement on the unprocessed film, probe distance is 1 mm and the applied field is parallel to the current direction. A normalized magneto resistance curve showing a negative 4% effect, inset shows Magnetoresistance curve of GMR device with Fe/Cr/Fe multi layer is shown in FIG. 5C.

Figure 2:
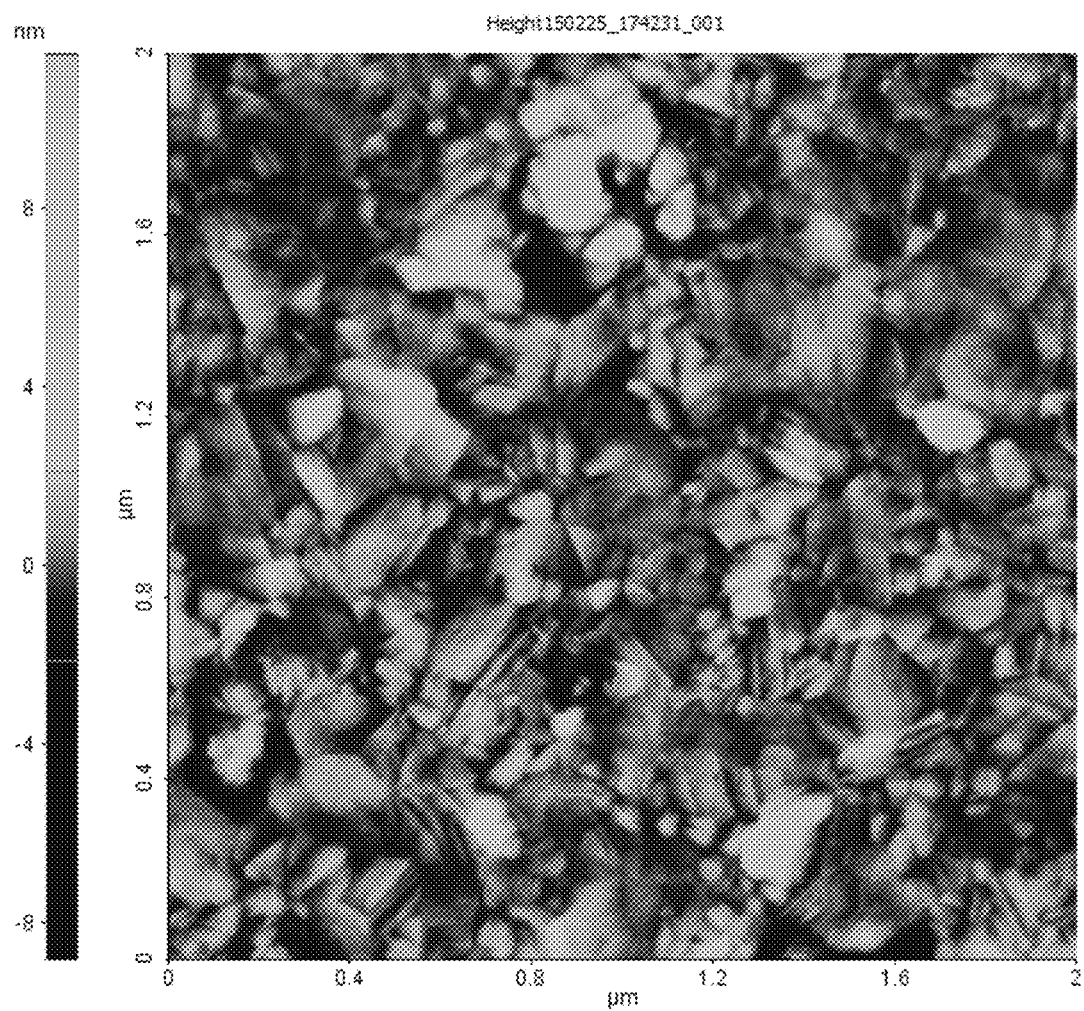
FIG. 2 is an atomic force microscopy image of Graphene on top of NiFe.
Figure 3:
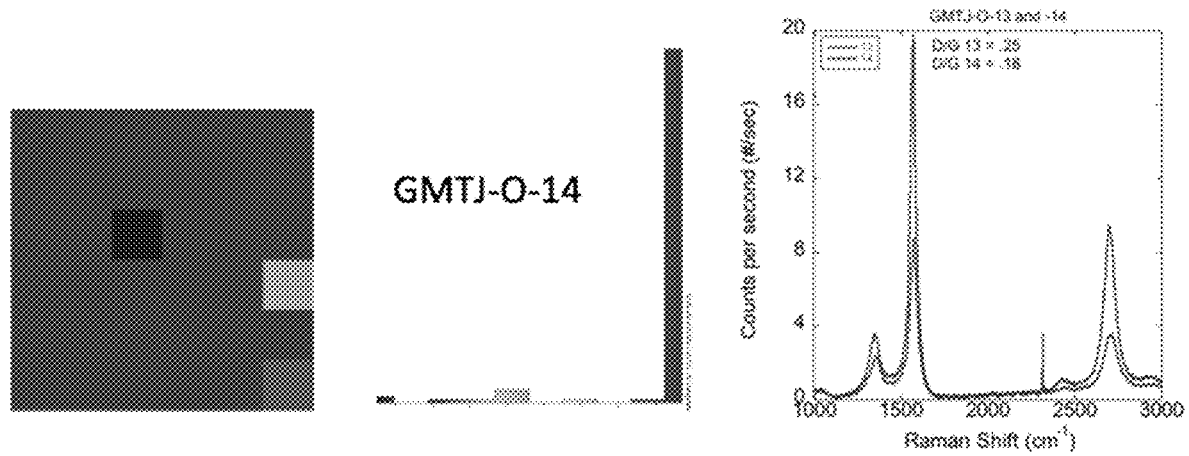
FIG. 3 illustrates a raman map of a 5×5 um area on the left, showing a uniform coverage, dark means>5 multilayer of graphene. Middle illustrates layer thickness hystogram of 5 by 5 mm² area, almost exclusively multi layer graphene. Right is a Raman spectrum of a typical spot showing high quality Graphene.

Atomic force microscopy of the sample after anneal but before the second magnetic layer, see FIG. 1B, shows a smooth film (1 nm RMS), see FIG. 2. Raman studies, FIG. 3, show a uniform covering of multilayer graphene over a 5 by 5 μm area and the Raman spectra of a typical spot shows a D over G of 0.18 indicating high quality graphene from a solid source amorphous carbon layer was obtained on the top surface of NiFe.

Figure 4:
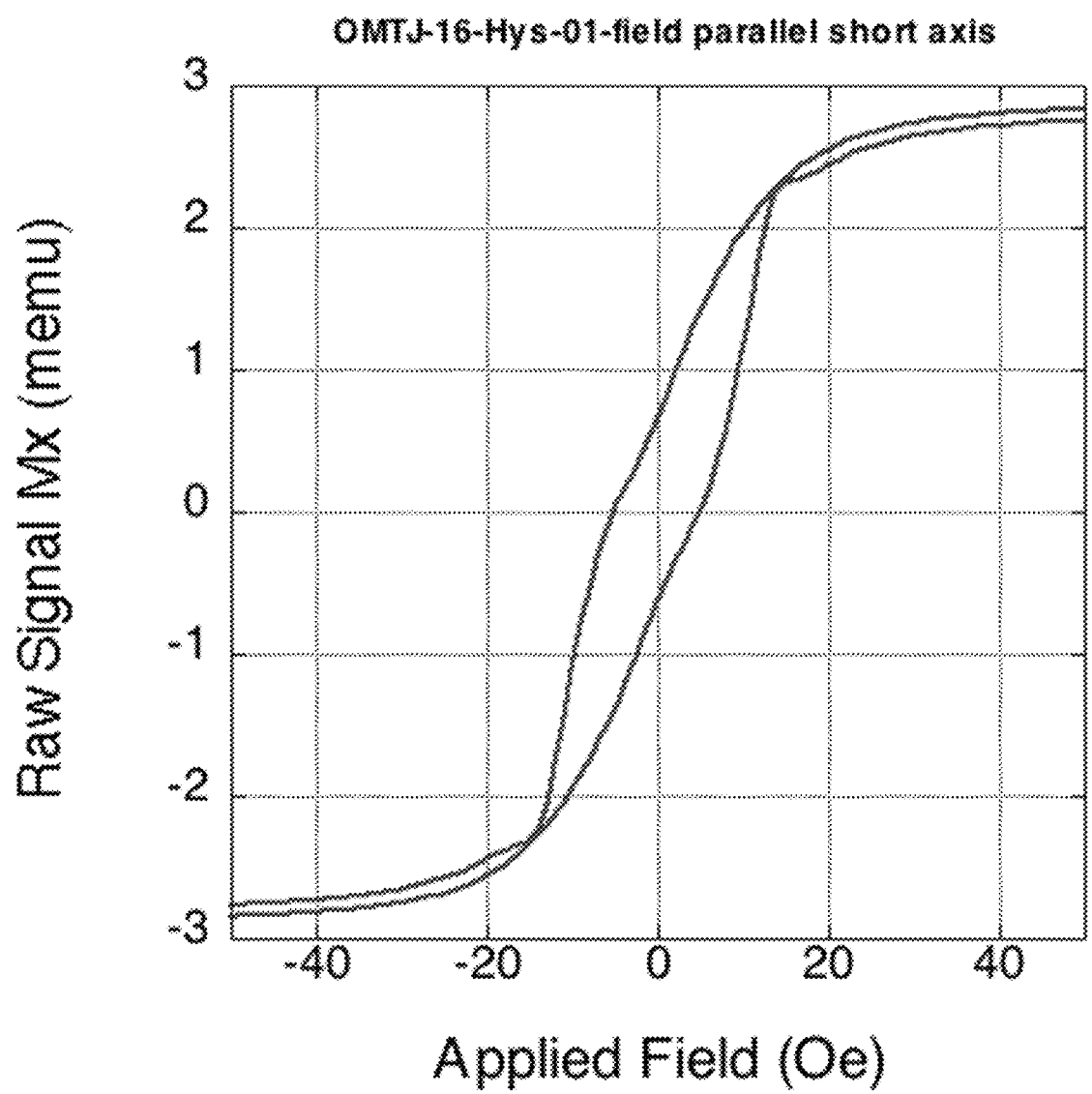
FIG. 4 illustrates raw signal Mx vs applied field. Magnetic studies by vibrating sample magnetometer show the in-plane magnetization of the full sample.

Magnetic studies by vibrating sample magnetometer shown in FIG. 4, show the in-plane magnetization of the full sample (FIG. 1C). The shape of the hysteresis loop is indicative of an anti-ferromagnetic coupled system.

Here, the magnetization is reduced and plateaus around zero applied magnetic field, where the magnetization of the two layers cancel each other.

The resistance is lower at zero field and higher at large field. This is the opposite of conventional giant magneto resistance, which has a negative magneto resistance. This is direct confirmation of the spin filtering of majority carriers in the multilayer graphene spacer. The overall resistance of this sample was 12 Ohm.

There are many major advantages of this new method and device.

Some advantages include but are not limited to: 1) simple in situ processing using standard sputtering techniques; 2) High MR due to spin filtering of graphene; 3) High sensitivity and linear regime due to Anti-ferromagnetic coupling; and 4) Low resistance, thin well controlled multi layer graphene spacer layer.

Some further advantages include but are not limited to: 1) Positive magneto resistance can be combined with conventional negative magneto resistance in balancing circuits for even greater sensitivity; 2) Creates a diffusion barrier to prevent inter-diffusion of the two metal layers at high temperature needed for subsequent processing; 3) Provides control of the film thickness in discrete 0.3 nm steps down to monoatomic 0.3 nm thickness that is unachievable with competing materials; and 4) Removes the dangling bonds inherent in three-dimensional crystalline and amorphous materials thereby preventing formation of unwanted compounds at the interface between films.

This new magnetic field sensor using In Situ solid source graphene and graphene induced anti-ferromagnetic coupling and spin filtering can be used in many applications and are superior to the current state of the art because this new sensor overcomes the issues of the current sensors which either have low MR (AMR) high resistance (GMR, MTJs) or low sensitivity (Hall sensors).

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A magnetic field sensor formed by using in situ solid source graphene, that is absorbed and desorbed on a first ferromagnetic metal creating a graphene multilayer, and using the spin filtering and antiferromagnetic coupling of this graphene multilayer, comprising:
   a substrate comprising silicon wafers and an oxide layer;
   an amorphous carbon layer on the substrate grown by sputtering to control the amount of graphene;
   a first ferromagnetic metal surface grown in situ by sputtering on the amorphous carbon layer; wherein said amorphous carbon layer directly contacts said substrate and said first ferromagnetic metal surface
   wherein the first ferromagnetic metal surface comprises NiFe;
   an in-situ graphene film grown on top of the first ferromagnetic layer by first absorbing and then desorbing the amorphous carbon layer or solid source carbon, by in situ annealing of the first ferromagnetic layer;
   wherein the graphene film is multilayer;
   an interface between the multilayer graphene film and the first ferromagnetic metal surface;
   a second ferromagnetic film on the multilayer graphene film;
   wherein the second ferromagnetic film comprises CoFe;
   antiferromagnetic coupling of the first and second ferromagnetic layer due to this graphene multilayer;
   a spin/momentum filtering at the interface between the multilayer graphene film and the first ferromagnetic metal surface; and
   a capping layer on the second ferromagnetic film.

2. A magnetic field sensor formed by using in situ solid source graphene and using graphene induced anti-ferromagnetic coupling and spin filtering formed for the steps comprising:
   providing a substrate comprising silicon wafers and an oxide layer;
   performing DC magnetron sputtering to the substrate comprising silicon wafers and thermal oxide;
   back-sputtering the substrate,
   growing amorphous carbon on the substrate;
   sputtering and growing a first ferromagnetic metal surface on the amorphous carbon; wherein said amorphous carbon directly contacts said substrate and said first ferromagnetic metal surface
   wherein the first ferromagnetic metal surface comprises NiFe;
   annealing the substrate and the amorphous carbon and the first ferromagnetic metal surface;
   growing an in-situ graphene film by first absorbing and then desorbing the amorphous carbon layer or solid source carbon, by in situ annealing of the first ferromagnetic layer;
   wherein the graphene film is multilayer;

an interface between the multilayer graphene film and the first ferromagnetic metal surface;

sputtering and growing a second ferromagnetic on the multilayer graphene film;

wherein the second ferromagnetic film comprises CoFe;

antiferromagnetic coupling between the first and second ferromagnetic layer due to the graphene multilayer;

a spin/momentum filtering at the interface between the multilayer graphene film and the first ferromagnetic metal surface;

wherein the first ferromagnetic metal surface comprises NiFe;

and capping the second ferromagnetic film with a platinum layer.

3. The magnetic field sensor formed by using in situ solid source graphene and using graphene induced anti-ferromagnetic coupling and spin filtering of claim 2 wherein the steps of sputtering and annealing were performed in situ in a single chamber.

4. The magnetic field sensor formed by using in situ solid source graphene and using graphene induced anti-ferromagnetic coupling and spin filtering of claim 3 wherein the thermal oxide is 27.5 nm of thermal oxide and the graphene film is multilayer.

5. The magnetic field sensor formed by using in situ solid source graphene and using graphene induced anti-ferromagnetic coupling and spin filtering of claim 2 wherein the step of back-sputtering the substrate is performed in situ using DC magnetron sputtering for 3 minutes at 10 W, 100V in 20 mTorr of Argon.

6. The magnetic field sensor formed by using in situ solid source graphene and using graphene induced anti-ferromagnetic coupling and spin filtering of claim 2 wherein the step amorphous carbon was grown in situ at a rate of 0.31 nm per minute at 100 W in 3 mTorr of Ar.

7. The magnetic field sensor formed by using in situ solid source graphene and using graphene induced anti-ferromagnetic coupling and spin filtering of claim 2 wherein the first ferromagnetic metal surface is $Ni_{80}Fe_{20}$ and the step of growing the first ferromagnetic metal surface was in situ at a rate of 0.05 nm/sec at 100 W in 3 mTorr Ar.

8. The magnetic field sensor formed by using in situ solid source graphene and using graphene induced anti-ferromagnetic coupling and spin filtering of claim 2 wherein the step of annealing the substrate and the amorphous carbon and the first ferromagnetic metal surface was performed in situ at 875° C. for 10 minutes in a pressure below $2\times10^{-6}$ Torr.

9. The magnetic field sensor formed by using in situ solid source graphene and using graphene induced anti-ferromagnetic coupling and spin filtering of claim 2 further comprising a step of cooling the substrate and the amorphous carbon and the first ferromagnetic metal surface to room temperature after the step of annealing and prior to the step of sputtering and growing the second ferromagnetic film on the graphene film and wherein the second ferromagnetic film is $Co_{90}Fe_{10}$.

10. The magnetic field sensor formed by using in situ solid source graphene and using graphene induced anti-ferromagnetic coupling and spin filtering of claim 2 wherein the thickness of the platinum layer is 7.5 nm.

* * * * *